(12) United States Patent
Huang

(10) Patent No.: US 7,313,049 B2
(45) Date of Patent: Dec. 25, 2007

(54) OUTPUT CIRCUIT OF A MEMORY AND METHOD THEREOF

(75) Inventor: Chao-Sheng Huang, Taipei (TW)

(73) Assignee: Via Technologies, Inc., Taipei (TW)

( * ) Notice: Subject to any disclaimer, the term of this patent is extended or adjusted under 35 U.S.C. 154(b) by 111 days.

(21) Appl. No.: 11/385,535

(22) Filed: Mar. 20, 2006

(65) Prior Publication Data
US 2007/0115739 A1    May 24, 2007

(30) Foreign Application Priority Data
Nov. 24, 2005   (TW)   .............................. 94141260 A

(51) Int. Cl.
*G11C 8/00*   (2006.01)
*G11C 7/02*   (2006.01)
(52) U.S. Cl. .................... 365/230.05; 365/207
(58) Field of Classification Search ........... 365/230.05, 365/207, 203, 154
See application file for complete search history.

(56) References Cited

U.S. PATENT DOCUMENTS

| | | | |
|---|---|---|---|
| 6,046,942 A * | 4/2000 | Hwang et al. | 365/189.05 |
| 6,181,634 B1 | 1/2001 | Okita | |
| 6,222,777 B1 * | 4/2001 | Khieu | 365/189.02 |
| 6,317,379 B1 * | 11/2001 | Argyres | 365/230.05 |
| 6,665,215 B2 | 12/2003 | Thomas et al. | |
| 2005/0180197 A1 * | 8/2005 | Huang | 365/154 |

FOREIGN PATENT DOCUMENTS

| | | |
|---|---|---|
| JP | 2000215674 A | 8/2000 |
| TW | 1226638 | 1/2005 |
| TW | 1240277 | 9/2005 |

OTHER PUBLICATIONS

TW Office Action mailed Jul. 23, 2007.

* cited by examiner

*Primary Examiner*—Anh Phung
(74) *Attorney, Agent, or Firm*—Thomas, Kayden, Horstemeyer & Risley

(57) ABSTRACT

An output circuit of a memory is provided. The output circuit includes a first pre-charge circuit, coupled to a read bit line which is coupled to a plurality of memory cells, pre-charging the voltage of the read bit line to a logic high level before a stored bit of a target memory cell is read to the read bit line, wherein the target memory cell is one of the plurality of memory cells, and a sense amplifier, coupled to the read bit line, detecting the voltage of the read bit line after the stored bit of the target memory cell is read to the read bit line, and comparing the voltage of the read bit line with the logic high level to respectively generate a comparison result signal and an inverse comparison result signal to a first output node and a second output node.

21 Claims, 4 Drawing Sheets

OUTPUT CIRCUIT OF A MEMORY AND METHOD THEREOF

BACKGROUND OF THE INVENTION

1. Field of the Invention

The invention relates to an output circuit of a memory and a method thereof; more particularly, the invention relates to an output circuit and method thereof for a static random access memory (SRAM).

2. Description of the Related Art

Most memory data is stored in the form of binary bits with each bit stored in a memory cell as 0 or 1. The memory cells are arranged in a rectangular matrix and form the principle part of the memory. Before writing data to a specific memory cell, the memory cell is selected by an address latch circuit, and the bit is then written into the memory cell. Before reading data from a specific memory cell, the memory cell is selected by the address latch circuit, and the bit stored in the memory cell is then outputted in the form of current or voltage through the output circuit. Because the current or voltage outputted from the memory cell is very weak, it is amplified by a current or voltage amplifier to the level of standard digital signal strength.

Static random access memory (SRAM) is a kind of random access memory capable of keeping the data stored therein as long as power is supplied. Different from dynamic random access memory (DRAM), a SRAM does not need to be periodically refreshed, and the access time of a SRAM is shorter than that of a DRAM. Thus, SRAM is often used as the cache memory in a computer, or as part of the random access memory of a digital to analog converter in a graphics card.

The access time of a SRAM determines its performance, because the access time determines the operating speed of the memory and a controller or a central processing unit as a whole. Because there are thousands of SRAM cells coupled to a single output circuit, a great number of parasitic capacitors are formed and coupled to the output circuit. Since the driving ability of a SRAM cell is weak, the latency time caused by the parasitic capacitors is a key factor affecting the access time of a SRAM. Thus, an output circuit capable of reducing the SRAM access time to increase the performance of the SRAM is desirable.

BRIEF SUMMARY OF THE INVENTION

The invention provides an output circuit of a memory which can shorten the access time of a SRAM and improve the performance of the SRAM The output circuit of the present invention includes: a first pre-charge circuit coupled to a read bit line (RBL), which is coupled to a plurality of memory cells, for pre-charging the voltage of the read bit line to a logic high level before a stored bit of a target memory cell is read to the read bit line, wherein the target memory cell is one of the plurality of memory cells; a sense amplifier coupled to the read bit line, detecting the voltage of the read bit line after the stored bit of the target memory cell is read to the read bit line; comparing the voltage of the read bit line with the logic high state to respectively output a comparison result signal and an inverse comparison result signal to a first output node and a second output node, wherein the inverse comparison result signal is inverted to the comparison result signal.

The invention provides a method for outputting a data bit read from a target memory cell of a memory. The method includes: pre-charging a read bit line until the voltage of the read bit line reaches a logic high level wherein the read bit line is coupled to a plurality of memory cells of the memory; selecting the target memory cell from the plurality of memory cells to read the data bit from the target memory cell to the read bit line; detecting the voltage of the read bit line, and comparing the voltage of the read bit line with the logic high level to respectively generate a comparison result signal and an inverse comparison result signal to a first output node and a second output node wherein the inverse comparison result signal is inverted to the comparison result signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
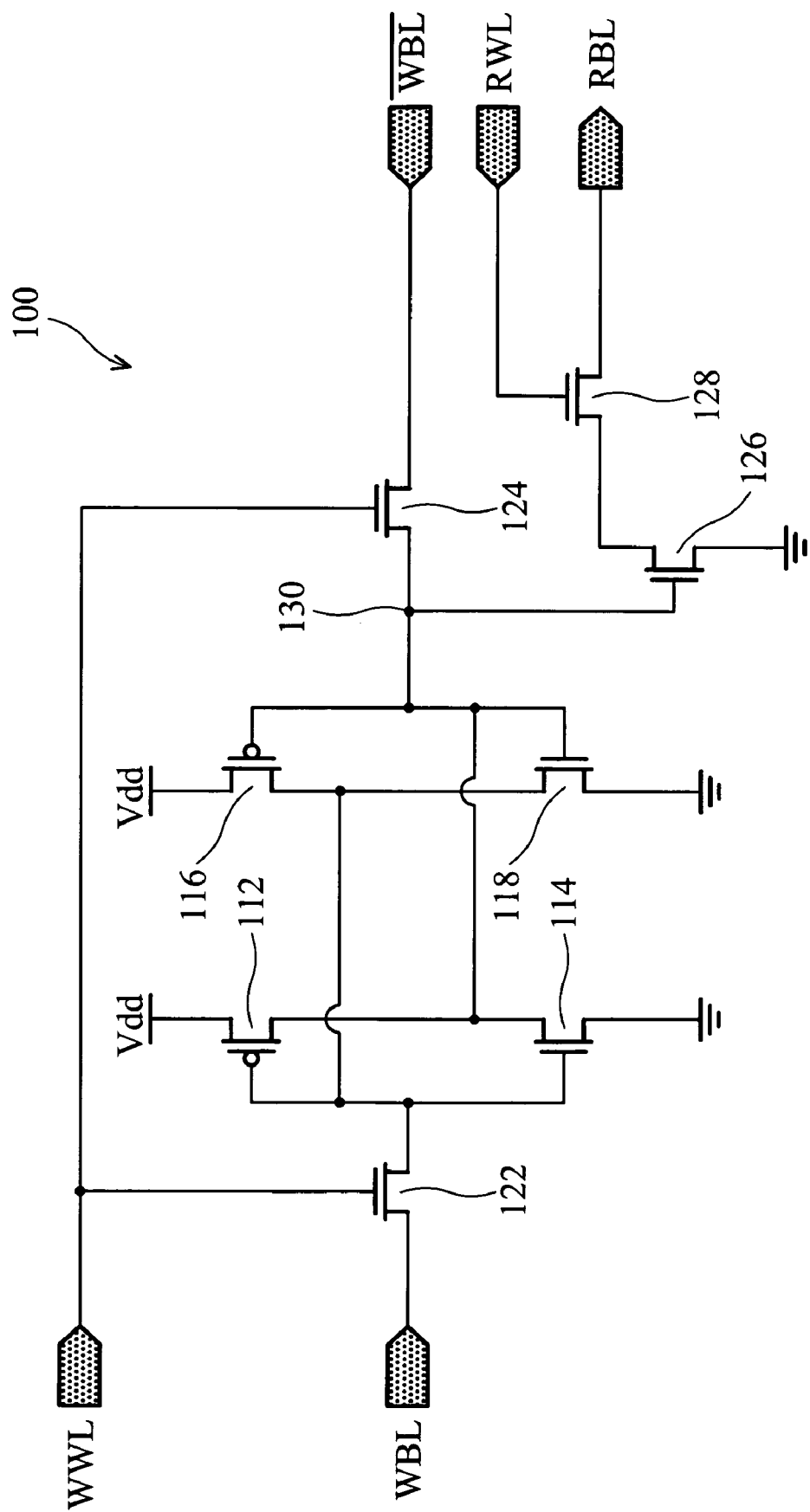
FIG. 1 is a circuit diagram of a SRAM cell.

FIG. 1 is a circuit diagram of a SRAM cell 100. SRAM cell 100 is a dual port cell with eight transistors and a single output terminal. The eight transistors include pull-up transistors 112 and 116, pull-down transistors 114 and 118, pass gate transistors 122 and 124, and read port transistors 126 and 128. The pull-up transistors 112 and 116 are PMOS transistors, the pull-down transistors 114 and 118, the pass gate transistors 122 and 124, and the read port transistors 126 and 128 are NMOS transistors.

Sources of the pull-up transistors 112 and 116 are respectively coupled to a voltage source Vdd. Drain of the pull-up transistor 112 is coupled with the source of the pass gate transistor 124, the drain of the pull-down transistor 114, and the gate of the pull-up transistor 116. Similarly, the drain of the pull-up transistor 116 is coupled with the source of the pass gate transistor 122, the drain of the pull-down transistor 118, and the gate of the pull-up transistor 112. The gate of the pull-up transistor 112 is coupled with the gate of the pull-down transistor 114; and the gate of the pull-up transistor 116 is coupled with the gate of the pull-down transistor 118 and the gate of the read port transistor 126. The sources of the pull-down transistors 114 and 118 are grounded, and the source of the read port transistor 126 is also grounded.

The drains of the pass gate transistors 122 and 124 are respectively coupled to the write bit line WBL and the write bit bar line $\overline{WBL}$. The gates of the pass gate transistors 122 and 124 are respectively coupled to the write word line WWL. The read port transistors 126 and 128 are series connected and coupled between the ground and the read bit line RBL; and the gate of the read port transistors 128 is coupled to the read word line RWL. The write bit line WBL, write bit bar line $\overline{\text{WBL}}$, write word line WWL, read bit line RBL, and the read word line RWL may be extended to other SRAM cells or other devices such as a row and column latch, a decoder, a select driver, a control logic circuit, a sense amplifier, a multiplexer, or a buffer.

Figure 2:
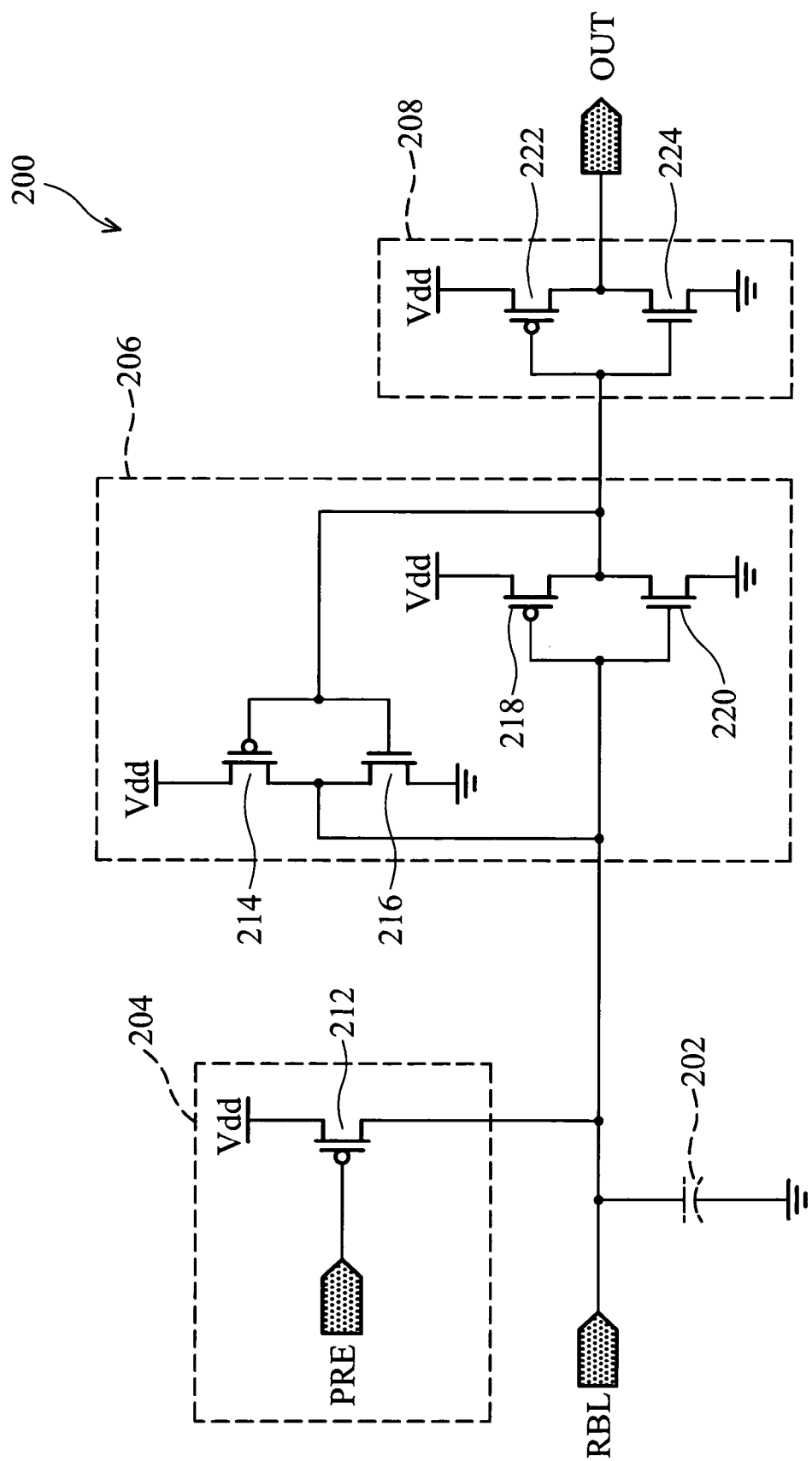
FIG. 2 is a circuit diagram of an output circuit of a SRAM.

FIG. 2 is an output circuit 200 of a SRAM. The output circuit 200 includes a pre-charge circuit 204, a data storage circuit 206, and an inverter 208. The transistors 212, 214, 218 and 222 are PMOS transistors, and the transistors 216, 220 and 224 are NMOS transistors. The input terminal of the output circuit 200 is a read bit line RBL, which is coupled to the output terminals of a plurality of SRAM cells 100 in FIG. 1. Because there are so many SRAM cells 100 coupled to the read bit line RBL, the read bit line RBL is coupled with a large parasitic capacitor which can be represented with a parasitic capacitor 202 coupled between the read bit line RBL and the ground in FIG. 2.

The value of data stored in the SRAM cell 100 of FIG. 1 may be 0 or 1, so the voltage at the node 130 in FIG. 1 may be a logic high level or logic low level depending on the value of data stored in the SRAM cell 100. If the voltage of node 130 is at the logic high level, the read port transistor 126 is turned on, otherwise the read port transistor 126 is turned off. Assume an SRAM cell 100 is going to be read. Before reading data of the SRAM cell 100, the read bit line RBL is charged to the logic high level of Vdd through the pre-charge circuit 204. To charge the read bit line RBL, a pre-charge signal PRE is first lowered to a logic low level of ground, the PMOS transistor 212 is turned on, and the read bit line RBL is charged to the logic high level of Vdd. After the read bit line RBL is charged completely, the pre-charge signal PRE is raised to a logic high level to turn off the PMOS transistor 212. The voltage of the read word line RWL of the selected SRAM cell 100 is then raised to a logic high level to turn on the read port transistor 128.

If the voltage at the node 130 is at a logic high level at this time, the read port transistors 126 and 128 are turned on. Because the source of the transistor 126 is grounded, the voltage of the read bit line RBL is lowered to ground. However, because the existing of the parasitic capacitor 202, it will defer the dropping of the voltage of the read bit line RBL, and the access time of the SRAM is lengthened. When the data storage circuit 206 detects the logic low level on the read bit line RBL, it outputs a voltage of logic high level. The inverter 208 then inverts the output of the data storage circuit 206, and outputs a voltage of logic low level on the output terminal OUT.

Otherwise, if the voltage at the node 130 is at a logic low level, the read port transistor 126 is turned off. Thus, the voltage on the read bit line RBL cannot be lowered through the read port transistors 126, and is still maintained at the logic high level after the read bit line RBL is pre-charged. When the data storage circuit 206 detects the logic high level on the read bit line RBL, a voltage of logic low level is then outputted. The inverter 208 then inverts the output of the data storage circuit 206, and outputs a voltage of logic high level on the output terminal OUT.

Figure 3:
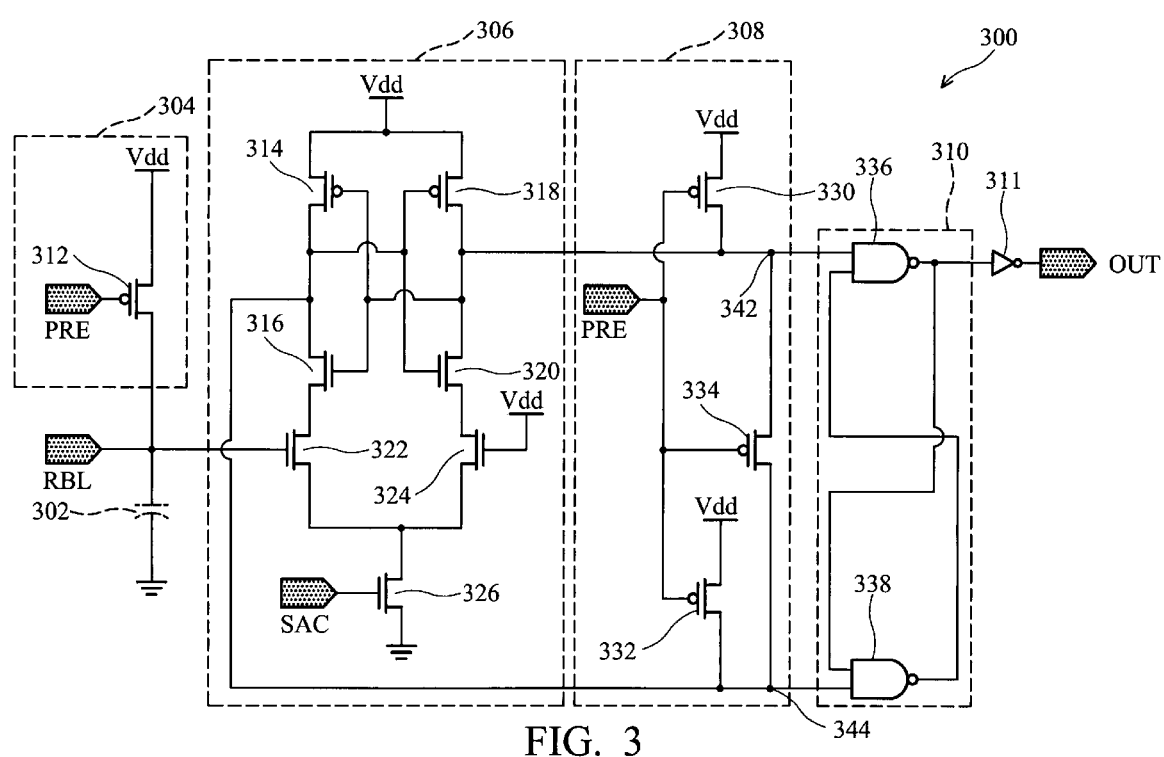
FIG. 3 is a circuit diagram of an output circuit of a SRAM according to the invention.

FIG. 3 is an output circuit 300 of a SRAM according to the invention. The output circuit 300 includes: a first pre-charge circuit 304, a second pre-charge circuit 308, a sense amplifier 306, a latch circuit 310, and an inverter 311. The transistors 312, 314, 318, 330, 332 and 334 are PMOS transistors, and the transistors 316, 320, 322, 324 and 326 are NMOS transistors. The input terminal of the output circuit 300 is the read bit line RBL which is coupled to the output terminals of a plurality of SRAM cells 100. Because there are so many SRAM cells 100 coupled to the read bit line RBL, the read bit line RBL is coupled with a large parasitic capacitor which can be represented with a parasitic capacitor 302 coupled between the read bit line RBL and the ground in FIG. 3.

The first pre-charge circuit 304 includes a PMOS transistor 312 coupled between the voltage source Vdd and the read bit line RBL; the gate of the PMOS transistor 312 is coupled to a pre-charge signal PRE. The sense amplifier 306 respectively outputs two mutually inverse output signals at the nodes 342 and 344 after comparing the voltage on the read bit line RBL with the logic high level of Vdd. The sense amplifier 306 includes NMOS transistors 316, 320, 322, 324 and 326 and PMOS transistors 314 and 318. The drain of the transistor 326 is coupled to the sources of the differential input transistors 324 and 322, the source of the transistor 326 is grounded, and the gate of the transistor 326 is coupled to a sense amplifier activation signal SAC. The gate of the differential input amplifier 322 is coupled to the read bit line RBL, and the drain of the differential input amplifier 322 is coupled to the source of the transistor 316. The gate of the differential input amplifier 324 is coupled to the voltage source Vdd, and the drain of the differential input amplifier 324 is coupled to the source of the transistor 320. The gate of the PMOS transistor 314 is coupled with the gate of the NMOS transistor 316, the drain of the PMOS transistor 318, and the drain of the NMOS transistor 320 at node 342. The gate of the PMOS transistor 318 is coupled with the gate of the NMOS transistor 320, the drain of the PMOS transistor 314, and the drain of the NMOS transistor 316 at node 344. The sources of the PMOS transistors 314 and 318 are coupled to the voltage source Vdd.

The second pre-charge circuit 308 includes PMOS transistors 330, 332 and 334. the gates of the PMOS transistor 330, 332 and 334 are all coupled to the pre-charge signal PRE. The source of the PMOS transistor 330 is coupled to the voltage source Vdd, and the drain of the PMOS transistor 330 is coupled to node 342. The source of the PMOS transistor 332 is coupled to the voltage source Vdd, and the drain of the PMOS transistor 332 is coupled to node 344. The PMOS transistor 334 is coupled between the nodes 342 and 344. The latch circuit 310 includes the NAND gates 336 and 338 for latching and storing the voltages of nodes 342 and 344. One input terminal of the NAND gate 336 is coupled to the node 342, and the other input terminal of the NAND gate 336 is coupled to the output terminal of the NAND gate 338. One input terminal of the NAND gate 338 is coupled to the node 344, and the other input terminal of the NAND gate 338 is coupled to the output terminal of the NAND gate 336. The inverter 311 is coupled to the output terminal of the NAND gate 336 of the latch circuit 310.

Figure 4:
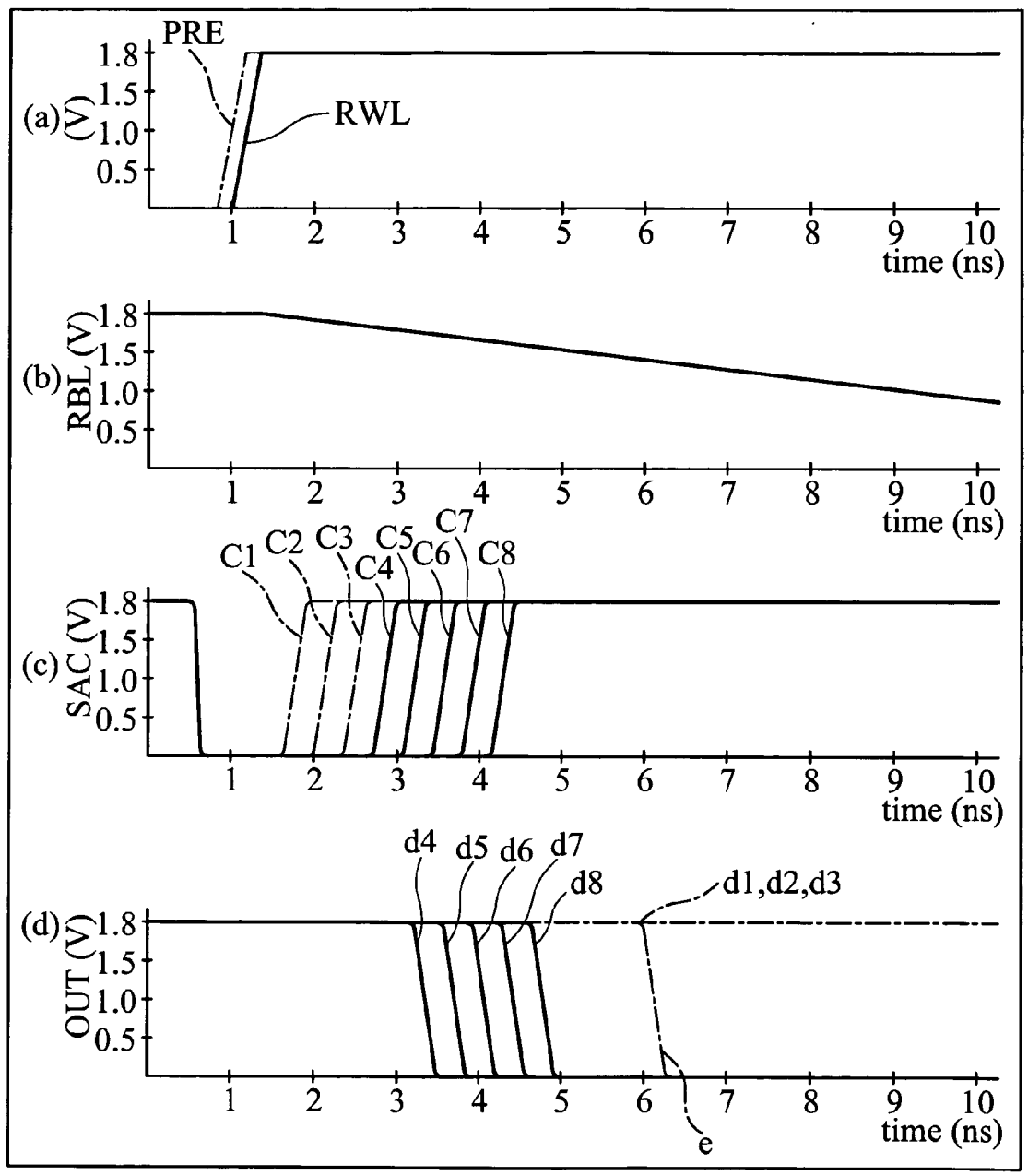
FIG. 4(a) shows the timing sequence of a pre-charge signal PRE in FIG. 3 and the voltage of a read word line.
FIG. 4(b) shows the timing sequence of the voltage of a read bit line in FIG. 3.
FIG. 4(c) shows the timing sequence of a sense amplifier activation signal SAC in FIG. 3.
FIG. 4(d) shows the timing sequence of an output signal of the output circuit in FIG. 3.

Data value stored in the SRAM cell 100 of FIG. 1 may be 0 or 1, and the voltage at the node 130 in FIG. 1 may be a logic high level or logic low level depending on data value stored in the SRAM cell 100. If the voltage of node 130 is at the logic high level, the read port transistor 126 is turned on; otherwise the read port transistor 126 is turned off. Assume a SRAM cell 100 is going to be read, before reading data of the SRAM cell 100, the read bit line RBL is charged to the logic high level (ex. Vdd) through the first pre-charge circuit 304. To charge the read bit line RBL, a pre-charge signal PRE is first lowered to a logic low level of ground, the PMOS transistor 312 is then turned on, and the read bit line RBL is charged to the logic high level (ex. Vdd). At the same time, the pre-charge charge signal PRE in the second pre-charge circuit 308 is also lowered to a logic low level (ex. Ground) to turn on the PMOS transistors 330, 332 and 334. Then the voltages of nodes 342 and 344 are raised to the logic high level (ex. Vdd). The nodes 342 and 334 are respectively being as the coupling points of the two mutually inverse output terminals of t h e sense amplifier 306 and the two mutually inverse input terminals of the latch circuit 310. After the read bit line RBL is charged completely, the pre-charge signal PRE at the gate of the PMOS transistor 312 is raised to a logic high level to turn off the PMOS transistor 312. The PMOS transistors 330, 332 and 334 are then turned off due to the pre-charge signal PRE is raised to the logic high level, resulting in the disconnection of the nodes 342 and 344. The voltage of the read word line RWL of the selected SRAM cell 100 is then raised to a logic high level to turn on the read port transistor 128. Referring to FIG. 4(a), the pre-charge signal PRE is first raised to the logic high level, and the voltage on the read word line RWL is then raised to the logic high level.

If the voltage at the node 130 is at a logic high level, the read port transistors 126 and 128 are turned on. Because the source of the transistor 126 is grounded, the voltage of the read bit line RBL is lowered to the ground voltage. However, because the existing of the parasitic capacitor 302, voltage dropping of the read bit line RBL will be delayed as shown in FIG. 4(b). The sense amplifier 306 compares the voltages at the gates of the two differential input transistors 322 and 324 to output two mutually inverse voltages at the. nodes 342 and 344. Because the voltage of the read bit line RBL drops slowly, the sense amplifier 306 must be activated at an appropriate time when the voltage at the gate of the NMOS transistor 322 drops enough for the sense amplifier 306 to correctly detect the voltage drop. However, the time for activating the sense amplifier 306 should not be too late to lengthen the access time of the SRAM. The sense amplifier 306 can be activated by raising the voltage of the sense amplifier activation signal SAC to a logic high level to turn on the NMOS transistor 326. Referring to FIG. 4(c), if the sense amplifier activation signal SAC is raised too early to the logic high level as shown with the dotted lines C1 to C3, the sense amplifier 306 outputs a wrong voltage of logic high level as shown with the dotted lines d1 to d3 in FIG. 4(d). Otherwise, if the sense amplifier activation signal SAC is raised to the logic high level at an appropriate time as shown with the solid lines C4 to C8, the sense amplifier 306 outputs a correct voltage of logic low level at the node 342 as shown with the solid lines d4 to d8 in FIG. 4(d), and also outputs a voltage of logic high level at the node 344.

The latch circuit 310 includes the NAND gates 336 and 338. The latch circuit 310 detects the output voltages of the sense amplifier 306 at nodes 342 and 344. The latch circuit 310 also latches and outputs a voltage of logic high level which is inverse to the voltage at the node 342. The inverter 311 then inverts the output of the latch circuit 310, and outputs a voltage of logic low level on the output terminal OUT.

On the other hand, if the voltage at the node 130 is at a logic low level, the read port transistor 126 is turned off. Thus, the voltage on the read bit line RBL cannot be lowered through the read port transistors 126, and is still maintained at the logic high level after the read bit line RBL is pre-charged. Because the voltages of the gates of the differential input transistors 322 and 324 are both at the logic high level, the sense amplifier 306 cannot produce a correct output. To solve this problem, the gate width of the differential input transistor 322 is extended. For example, the gate width of the differential input transistor 322 may be 1.5 times as long as that of the differential input transistor 324. Thus, when the gates of the differential input transistors 322 and 324 are both coupled to the same voltage of logic high level (ex. Vdd), because the differential input transistor 322 has smaller gate resistance, the drain of the differential input transistor 322 has a stronger ability to pull down its voltage than that of the differential input transistor 324, resulting in a voltage of logic low level at the drain of the transistor 316 and a voltage of logic high level at the drain of the transistor 320. When the sense amplifier 306 detects the logic high level on the read bit line RBL, a voltage of logic low level at the node 344 is outputted. The latch circuit 310 then detects the output voltages of the sense amplifier 306 at nodes 342 and 344, and latches and outputs a voltage of logic low level which is inversed to the voltage at the node 342. Finally, the inverter 311 inverts the output of the latch circuit 310, and outputs a voltage of logic high level on the output terminal OUT.

Finally, the output signals of the output circuits 200 and 300 can be compared with FIG. 4(d). If the sense amplifier activation signal SAC of output circuit 300 is activated at an appropriate time, such as those shown with the solid lines C4 to C8, the corresponding output signals of the output circuit 300 are shown with the solid lines d4 to d8 in FIG. 4(d). The output signals of the output circuit 200 are shown with the dotted line e in FIG. 4(d). The output signals d4 to d8 of the output circuit 300 is obviously faster than the output signal e of the output circuit 200 by 1 to 3 nanoseconds, thus using the output circuit 300 of the invention in a SRAM can shorten the access time of the SRAM and improves the performance of the SRAM.

The invention uses a sense amplifier in the output circuit of a SRAM to amplify the tiny differential signals and to shorten the access time of the SRAM. The two input terminals of the sense amplifier are respectively coupled to a, voltage source Vdd and a read bit line. To prevent the situation in which the sense amplifier cannot produce a correct output signal when both of the two input terminals of the sense amplifier are coupled to a logic high level, the gate width of the transistor coupled to the read bit line is increased to reduce the gate resistance of the transistor. Thus, the output circuit of the invention can shorten the access time of a SRAM and improve the performance of the SRAM.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output circuit of a memory, comprising:
a first pre-charge circuit, coupled to a read bit line which is coupled to a plurality of memory cells, for pre-charging the voltage of the read bit line to a logic high level before a stored bit of a target memory cell is read to the read bit line, wherein the target memory cell is one of the plurality of memory cells; and
a sense amplifier, coupled to the read bit line, for detecting the voltage of the read bit line after the stored bit of the target memory cell is read to the read bit line, and comparing the voltage of the read bit line with the logic high level to output respectively a comparison result signal and an inverse comparison result signal to a first output node and a second output node, wherein the inverse comparison result signal is inverted to the comparison result signal.

2. The output circuit as claimed in claim 1, wherein the sense amplifier comprises a first differential input transistor and a second differential input transistor, wherein the gate of the first differential input transistor is coupled to the read bit line and the gate of the second differential input transistor is coupled to a positive voltage source of the logic high level, wherein the gate width of the first differential input transistor is longer than that of the second differential input transistor to reduce a gate resistance of the first differential input transistor such that the sense amplifier outputs correctly the comparison result signal when the voltage of the read bit line is at the logic high level.

3. The output circuit as claimed in claim 2, wherein both the first differential input transistor and the second differential input transistor are NMOS transistors.

4. The output circuit as claimed in claim 2, wherein the gate width of the first differential input transistor is substantially 1.5 times as long as that of the second differential input transistor.

5. The output circuit as claimed in claim 2, the sense amplifier thereof further comprising:
    a first PMOS transistor, coupled between the positive voltage source of the logic high level and the first output node, wherein the gate of the first PMOS transistor is coupled to the second output node;
    a second PMOS transistor, coupled between the positive voltage source of the logic high level and the second output node, wherein the gate of the second PMOS transistor is coupled to the first output node;
    a first NMOS transistor, coupled between the first output node and the drain of the first differential input transistor, wherein the gate of the first NMOS transistor is coupled to the second output node;
    a second NMOS transistor, coupled between the second output node and the drain of the second differential input transistor, wherein the gate of the second NMOS transistor is coupled to the first output node; and
    a third NMOS transistor, coupled between the sources of the first and second differential input transistors and a ground voltage source of a logic low level, wherein the gate of the third NMOS transistor is coupled to a sense amplifier activation signal which can turn on the third NMOS transistor to activate the sense amplifier.

6. The output circuit as claimed in claim 1, wherein the output circuit further comprises a second pre-charge circuit, coupled between the first output node and the second output node, for pre-charging the voltages of the first output node and the second output node to a logic high level before the stored bit of the target memory cell is read to the bit line.

7. The output circuit as claimed in claim 6, wherein the second pre-charge circuit comprising:
    a third PMOS transistor, coupled between the positive voltage source of the logic high level and the second output node, wherein the gate of the third PMOS transistor is coupled to a pre-charge signal which can turn on the third PMOS transistor to charge the second output node to the logic high level;
    a fourth PMOS transistor, coupled between the positive voltage source of the logic high level and the first output node, wherein the gate of the fourth PMOS transistor is coupled to the pre-charge signal which can turn on the fourth PMOS transistor to charge the first output node to the logic high level; and
    a fifth PMOS transistor, coupled between the first output node and the second output node, wherein the gate of the fifth PMOS transistor is coupled to the pre-charge signal which can turn on the fifth PMOS transistor to couple the first output node and the second output node.

8. The output circuit as claimed in claim 1, wherein the first pre-charge circuit comprises a sixth PMOS transistor, coupled between the positive voltage source of the logic high level and the read bit line, wherein the gate of the sixth PMOS transistor is coupled to a pre-charge signal which can turn on the sixth PMOS transistor to charge the read bit line to the logic high level.

9. The output circuit as claimed in claim 1, wherein the output circuit further comprises a latch circuit, coupled to the sense amplifier through the first output node and the second output node, for storing the comparison result signal output from the sense amplifier.

10. The output circuit as claimed in claim 9, the latch circuit thereof comprising:
    a first NAND gate, wherein the two input terminals of the first NAND gate are respectively coupled to the first output node and the output terminal of a second NAND gate;
    the second NAND gate, wherein the two input terminals of the second NAND gate are respectively coupled to the second output node and the output terminal of the first NAND gate.

11. The output circuit as claimed in claim 9, wherein the output circuit further comprises an inverter, coupled to the latch circuit, for inverting the comparison result signal and outputting it to an output terminal of the output circuit.

12. The output circuit as claimed in claim 1, each of the plurality of memory cells comprising:
    a first read port transistor, coupled between the drain of a second read port transistor and the read bit line, wherein the gate of the first read port transistor is coupled to a read word line which turns on the first read port transistor to couple the drain of the second read port transistor with the read bit line, wherein a memory cell is selected as the target memory cell if the voltage of the read word line coupled to the memory cell is raised to the logic high level; and
    a second read port transistor, wherein the source of the second read port transistor is coupled to the ground voltage source of the logic low level, and whether the gate of the second read port transistor is coupled to the logic low or high level depends on the bit stored in the memory cell;
    wherein the first read port transistor and the second read port transistor are turned on to pull down the voltage of the read bit line to the logic low level if the memory cell is selected and the gate of the second read port transistor is coupled to the logic high voltage.

13. The output circuit as claimed in claim 1, wherein the memory is a static random access memory (SRAM).

14. A method for outputting a data bit read from a target memory cell of a memory, comprising:
    pre-charging a read bit line until the voltage of the read bit line reaches a logic high level, wherein the read bit line is coupled to a plurality of memory cells of the memory;
    selecting the target memory cell from the plurality of memory cells to read the data bit from the target memory cell to the read bit line;
    detecting the voltage of the read bit line; and
    comparing the voltage of the read bit line with the logic high level to generate respectively a comparison result signal and an inverse comparison result signal to a first output node and a second output node, wherein the inverse comparison result signal is inverted to the comparison result signal.

15. The method as claimed in claim 14, further comprising raising the voltages of the first and second output nodes to the logic high level before the data bit is read to the read bit line.

16. The method as claimed in claim 14, further comprising inverting the comparison result signal and outputting the comparison result signal after inverting.

17. The method as claimed in claim 14, further comprising using a sense amplifier activation signal to activate the comparing step at an appropriate time.

18. The method as claimed in claim 14, wherein the comparing step is implemented with a sense amplifier which includes two differential input transistors whose gate lengths are not the same such that the sense amplifier outputs correctly the comparison result signal when the voltage of the read bit line is the logic high level.

19. The method as claimed in claim 14, wherein the memory is a static random access memory (SRAM).

20. The method as claimed in claim 14, wherein the voltage of the read bit line is pulled down to a logic low level after the data bit is read to the read bit line if the data bit is 1, and the comparison result signal is a voltage of the logic low level in the comparing step.

21. The method as claimed in claim 14, wherein the voltage of the read bit line is pulled up to a logic high level after the data bit is read to the read bit line if the data bit is 0, and the comparison result signal is a voltage of the logic high level in the comparing step.

* * * * *